(12) United States Patent
Miyagawa et al.

(10) Patent No.: US 9,620,699 B2
(45) Date of Patent: Apr. 11, 2017

(54) MANUFACTURING METHOD FOR THERMOELECTRIC CONVERSION DEVICE

(71) Applicant: DENSO CORPORATION, Kariya, Aichi-pref. (JP)

(72) Inventors: Eijirou Miyagawa, Tokai (JP); Keita Saitou, Chita-gun (JP); Yoshihiko Shiraishi, Nagoya (JP); Yoshitaro Yazaki, Anjo (JP); Toshihisa Taniguchi, Handa (JP); Atusi Sakaida, Nagoya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/763,147

(22) PCT Filed: Jan. 23, 2014

(86) PCT No.: PCT/JP2014/051375
§ 371 (c)(1),
(2) Date: Jul. 23, 2015

(87) PCT Pub. No.: WO2014/115803
PCT Pub. Date: Jul. 31, 2014

(65) Prior Publication Data
US 2015/0372215 A1 Dec. 24, 2015

(30) Foreign Application Priority Data
Jan. 24, 2013 (JP) ................................. 2013-011514

(51) Int. Cl.
*H01L 21/00* (2006.01)
*H01L 35/34* (2006.01)
(Continued)

(52) U.S. Cl.
CPC .............. *H01L 35/32* (2013.01); *H01L 35/08* (2013.01); *H01L 35/34* (2013.01)

(58) Field of Classification Search
CPC .......... H01L 35/08; H01L 35/32; H01L 35/34
(Continued)

(56) References Cited

U.S. PATENT DOCUMENTS

| 6,127,619 A | 10/2000 | Xi et al. |
| 2007/0175506 A1 | 8/2007 | Horio et al. |
| 2015/0144171 A1 | 5/2015 | Taniguchi et al. |

FOREIGN PATENT DOCUMENTS

| JP | H08153899 A | 6/1996 |
| JP | 2002319713 A | 10/2002 |

(Continued)

OTHER PUBLICATIONS

International Preliminary Report on Patentability and Written Opinion (in Japanese with English Translation) for PCT/JP2014/051375, mailed Aug. 6, 2015.
(Continued)

*Primary Examiner* — Lindsey Bernier
(74) *Attorney, Agent, or Firm* — Harness, Dickey & Pierce, P.L.C.

(57) ABSTRACT

An insulating substrate is prepared. In this substrate, plural via holes penetrating in a thickness direction are filled with a conductive paste. This paste is produced by adding an organic solvent to a powder of an, and by processing the power of the alloy to a paste. The substrate is then pressed from a front surface and a back surface of the substrate, while being heated. The conductive paste is solid-phase sintered and interlayer connecting members are formed. A front surface protective member is disposed on a front surface of the substrate and a back surface protective member is disposed on a back surface of the substrate, and a (Continued)

laminate is formed. The laminate is integrated by a lower pressure being applied while heating at a lower temperature, compared to the temperature and pressure in the process of forming the interlayer connecting members.

14 Claims, 10 Drawing Sheets

(51) Int. Cl.
    *H01L 35/30*     (2006.01)
    *H01L 35/32*     (2006.01)
    *H01L 35/08*     (2006.01)

(58) Field of Classification Search
    USPC .............................. 438/54, 55; 136/201, 205
    See application file for complete search history.

(56) References Cited

FOREIGN PATENT DOCUMENTS

| | | | |
|---|---|---|---|
| JP | 2005353710 A | 12/2005 | |
| JP | 2007194438 A | 8/2007 | |
| JP | 2008016598 A | 1/2008 | |
| JP | 2009170438 A | 7/2009 | |
| JP | 2012129516 A | 7/2012 | |
| JP | 2014007376 A | 1/2014 | |
| WO | WO-2013179840 A1 | 12/2013 | |

OTHER PUBLICATIONS

International Search Report and Written Opinion (in Japanese with English Translation) for PCT/JP2014/051375, mailed Apr. 1, 2014; ISA/JP.

MANUFACTURING METHOD FOR THERMOELECTRIC CONVERSION DEVICE

CROSS REFERENCE TO RELATED APPLICATIONS

This application is a U.S. National Phase Application under 35 U.S.C. 371 of International Application No. PCT/JP2014/051375 filed on Jan. 23, 2014 and published in Japanese as WO 2014/115803 A1 on Jul. 31, 2014. This application is based on and claims the benefit of priority from Japanese Application No. 2013-011514 filed on Jan. 24, 2013. The entire disclosures of all of the above applications are incorporated herein by reference.

BACKGROUND

Technical Field

The present invention relates to a manufacturing method for a thermoelectric conversion device that includes a process for solid-phase sintering a conductive paste and forming an interlayer connecting member.

Background Art

Conventionally, as a manufacturing method for a thermoelectric conversion device, for example, PTL 1 proposes a manufacturing method such as that below. That is, in this manufacturing method, first, through holes are formed in an insulating mold, and the through holes are regularly filled with a first conductive paste composed of Bi, Te, Se, and the like and a second conductive paste composed of Bi, Sb, Te, and the like.

In addition, a plurality of front surface patterns that come into contact with adjacent first and second conductive pastes are formed on the front surface of the insulating mold. Furthermore, a plurality of back surface patterns that come into contact with the first conductive paste, as well as the second conductive paste that is in contact with front surface patterns other than the front surface patterns that are in contact with the first conductive paste, are formed on the back surface of the insulating mold.

Subsequently, the insulating mold is heat-treated for 10 hours at 460° C. in an Ar gas atmosphere, thereby forming an N-type thermoelectric conversion element (interlayer connecting member) from the first conductive paste and a P-type thermoelectric conversion element (interlayer connecting member) from the second conductive paste. At this time, the N-type thermoelectric conversion element and the P-type thermoelectric conversion element are connected to the front surface patterns and the back surface patterns as well. As a result, a thermoelectric conversion device is manufactured in which a plurality of N-type thermoelectric conversion elements and a plurality of P-type thermoelectric conversion elements are alternately connected in series.

When the insulating mold is heat-treated for 10 hours at 460° C., because the melting points of Bi and Te are lower than 460° C., the N-type thermoelectric conversion element and the P-type thermoelectric conversion element (alloys) are formed by liquid-phase sintering.

PATENT LITERATURE

PTL 1 JP-A-H08-153899

Technical Problem

However, a problem occurs in that, in actuality, electric power is not readily generated in an alloy that is formed by liquid-phase sintering, because the crystalline structures of the metal atoms are random.

Here, an alloy formed by solid-phase sintering is laminated while retaining a predetermined crystalline structure. Therefore, it is known that large electric power can be generated when the alloy is used in a thermoelectric conversion device. Thus, forming the N-type thermoelectric conversion elements and the P-type thermoelectric conversion elements through application of solid-phase sintering in the manufacturing method in above-described PTL 1 can be considered.

However, the following problem occurs when the process forming the N-type thermoelectric conversion elements and the P-type thermoelectric conversion elements and the process for joining the N-type thermoelectric conversion elements and the P-type thermoelectric conversion elements with the front surface patterns and the back surface patterns are simultaneously performed.

In other words, high pressure is required to be applied while heating is performed at a high temperature, even when solid-phase sintering is performed. Therefore, an alloy layer that is composed of the N-type thermoelectric conversion element, the P-type thermoelectric conversion element, the front surface pattern, and the back surface pattern may be formed between the N-type thermoelectric conversion elements and the P-type thermoelectric conversion elements, and the front surface patterns and the back surface patterns. In this case, electrons easily move between the N-type thermoelectric conversion elements and the P-type thermoelectric conversion elements, and the front surface patterns and the back surface patterns, via the alloy layer, making power generation difficult. The problem of an alloy layer being formed also similarly occurs when the N-type thermoelectric conversion elements and the P-type thermoelectric conversion elements are formed by liquid-phase sintering.

Therefore, setting the heating temperature, pressurizing force, and the like in detail has been considered to prevent the formation of an alloy layer. However, in such methods, the manufacturing process becomes complicated.

The above-described problem does not occur only in thermoelectric conversion devices that have the N-type thermoelectric conversion elements and the P-type thermoelectric conversion elements. That is, thermoelectric effect occurs whenever two different types of metals are physically bonded. Therefore, the above-described problem also similarly occurs when, for example, a thermoelectric conversion device is manufactured in which the through holes are filled only with a conductive paste composed of Bi, Te, Se, and the like, and the front surface patterns and the back surface patterns are formed by a material differing from the alloy into which the conductive paste has been solid-phase sintered.

SUMMARY

It is thus desired to provide a manufacturing method for a thermoelectric conversion device that is capable of suppressing the formation of an alloy layer composed of an interlayer connecting member and a front surface pattern or a back surface pattern, while simplifying the manufacturing process.

An exemplary embodiment provides a manufacturing method for a thermoelectric conversion device, including: a step of preparing an insulating substrate that is configured to contain a thermoplastic resin, in which a plurality of via holes that penetrate in a thickness direction are formed, and the via holes are filled with a conductive paste that is produced by adding an organic solvent to a powder of an alloy in which a plurality of metal atoms retain a predetermined crystalline structure and by processing the powder of the alloy into a paste; a step of solid-phase sintering the conductive paste and forming interlayer connecting members by pressing the insulating substrate from a front surface of the insulating substrate and a back surface on a side opposite to that of the front surface, while heating; a step of forming a laminate by disposing a front surface protective member having front surface patterns that come into contact with predetermined interlayer connecting members on the front surface of the insulating substrate and disposing a back surface protective member having back surface patterns that come into contact with predetermined interlayer connecting members on the back surface of the insulating substrate; and a step of integrating the laminate while electrically connecting the interlayer connecting members to the front surface patterns and the back surface patterns, by pressing the laminate from the lamination direction while heating. In the step of integrating the laminate, a lower pressure is applied while heating at a lower temperature, compared to the temperature and pressure in the step of forming the interlayer connecting members.

As a result, the step of forming the interlayer connecting members and the step of integrating the laminate while electrically connecting the interlayer connecting members to the front surface patterns and the back surface patterns are performed as separate steps. Therefore, manufacturing conditions can be set for each step, and the manufacturing process can be simplified.

In addition, in the step of integrating the laminate, a lower pressurizing force is applied while heating at a lower temperature, compared to the step of forming the interlayer connecting members. Therefore, the formation of an alloy layer composed of the interlayer connecting members and the front surface patterns or the back surface patterns can be suppressed.

The reference numbers within the parentheses of the means in this section and the scope of claims indicate the correspondence relationships with specific means described in the embodiments described hereafter.

DESCRIPTION OF EMBODIMENTS

Embodiments of the present invention will hereinafter be described with reference to the drawings. Among the embodiments described below, sections that are the same as or equivalent to each other are described using the same reference numbers.

First Embodiment

Figure 1:
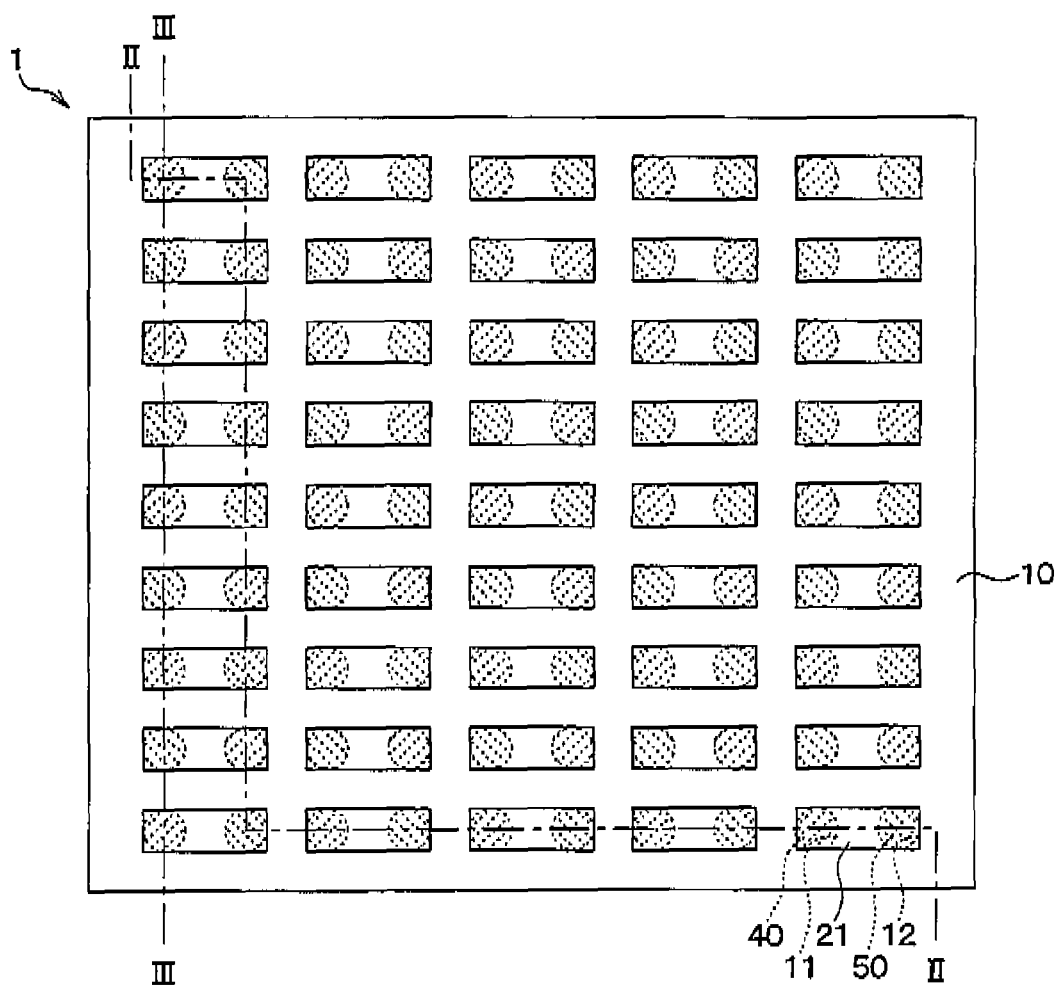
FIG. 1 is a planar view of a thermoelectric conversion device according to a first embodiment of the present invention.
Figure 2:
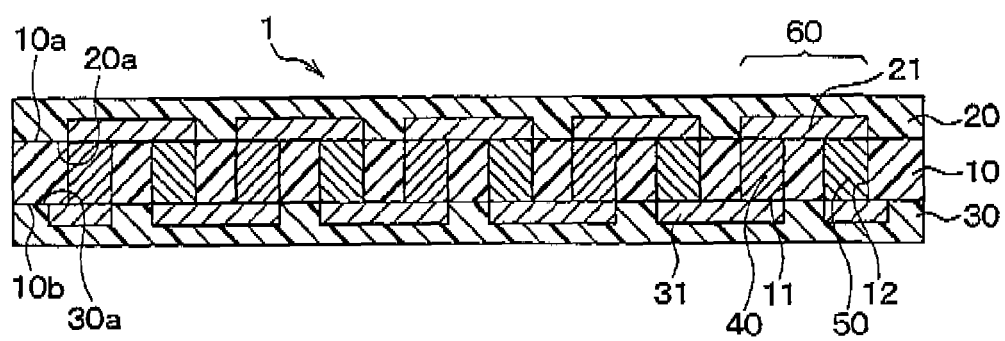
FIG. 2 is a cross-sectional view taken along line II-II in FIG. 1.
Figure 3:
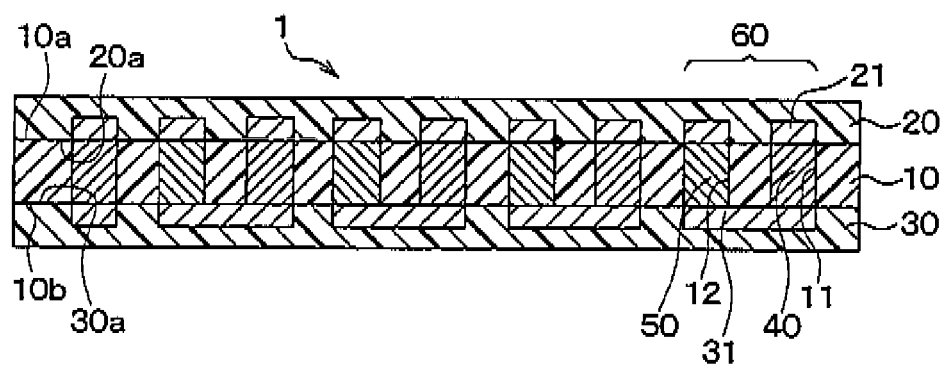
FIG. 3 is a cross-sectional view taken along line III-III in FIG. 1.

A first embodiment of the present invention will be described with reference to the drawings. As shown in FIG. 1 to FIG. 3, a thermoelectric conversion device 1 according to the present embodiment is configured so that an insulating substrate 10, a front surface protective member 20, and a back surface protective member 30 are integrated, and first and second interlayer connecting members 40 and 50 that are differing types of metals are alternately connected in series within the integrated body.

In FIG. 1, the front surface protective member 20 is omitted to facilitate understanding. In addition, although FIG. 1 is not a cross-sectional view, the first and second interlayer connecting members 40 and 50 are shaded.

According to the present embodiment, the insulating substrate 10 is composed of a thermoplastic resin film that has a rectangular planar shape and contains polyetheretherketone (PEEK) or polyetherimide (PEI). A plurality of first and second via holes 11 and 12 that perforate the insulating substrate 10 in a thickness direction are formed in a zigzag pattern in an alternating manner.

According to the present embodiment, the first and second via holes 11 and 12 have a circular cylindrical shape of which the diameter is fixed from a front surface 10a towards a back surface 10b. However, the first and second via holes 11 and 12 may have a tapered shape in which the diameter becomes smaller from the front surface 10a towards the back surface 10b, or may have a rectangular cylindrical shape.

The first interlayer connecting member 40 is disposed in the first via hole 11. The second interlayer connecting member 50 composed of a different type of metal than the first interlayer connecting member 40 is disposed in the second via hole 12. In other words, the first and second interlayer connecting members 40 and 50 are disposed in the insulating substrate 10 in an alternating manner.

Although not particularly limited thereto, for example, the first interlayer connecting member 40 is composed of a conductive paste that contains a powder (metal particles) of a Sb—Te based alloy or the like that configures the P-type. In addition, the second interlayer connecting member 50 is composed of a conductive paste that contains a powder (metal particles) of a Bi—Te based alloy or the like that configures the N-type.

The front surface protective member 20 that is composed of a thermoplastic resin film having a rectangular planar shape and containing polyetheretherketone (PEEK) or polyetherimide (PEI) is disposed on the front surface 10a of the insulating substrate 10. The planar shape of the front surface protective member 20 is the same size as that of the insulating substrate 10, and a plurality of front surface patterns 21 in which copper foil or the like is patterned are formed on the one surface 20a side opposing the insulating substrate 10, so as to be separated from each other. The front surface patterns 21 are each electrically connected to the first and second interlayer connecting members 40 and 50, as appropriate.

Specifically, when a single first interlayer connecting member 40 and a single second interlayer connecting member 50 that are adjacent to each other are considered to be a pair 60, the first and second interlayer connecting members 40 and 50 of each pair 60 are connected to the same front surface pattern 21. In other words, the first and second interlayer connecting members 40 and 50 of each pair 60 are electrically connected via the front surface pattern 21. According to the present embodiment, a single first interlayer connecting member 40 and a single second interlayer connecting member 50 that are adjacent to each other along a long-side direction of the insulating substrate 10 (the left/right direction of the paper in FIG. 1) are considered to be a pair 60.

In addition, the back surface protective member 30 that is composed of a thermoplastic resin film having a rectangular planar shape and containing polyetheretherketone (PEEK) or polyetherimide (PEI) is disposed on the back surface 10b of the insulating substrate 10. The planar shape of the back surface protective member 30 is the same size as that of the insulating substrate 10, and a plurality of back surface patterns 31 in which copper foil or the like is patterned are formed on the one surface 30a side opposing the insulating substrate 10, so as to be separated from each other. The back surface patterns 31 are each electrically connected to the first and second interlayer connecting members 40 and 50, as appropriate.

Specifically, in adjacent pairs 60, the first interlayer connecting member 40 of one pair 60 and the second interlayer connecting member 50 of the other pair 60 are connected to the same back surface pattern 31. In other words, the first and second interlayer connecting members 40 and 50 are electrically connected across the pairs 60, via the back surface pattern 31.

According to the present embodiment, as shown in FIG. 2, two pairs 60 that are aligned along the long-side direction of the insulating substrate 10 (the left/right direction of the paper in FIG. 1) are basically considered to be adjacent pairs 60. In addition, as shown in FIG. 3, the two pairs 60 that are aligned along the short-side direction (the up/down direction of the paper in FIG. 1) are considered to be adjacent pairs 60 on the outer edge of the insulating substrate 10.

Therefore, the first and second interlayer connecting members 40 and 50 are alternately connected in series in the long-side direction of the insulating substrate 10 and are again alternately connected in series in the long-side direction after turning back. In other words, the first and second interlayer connecting members 40 and 50 are alternately connected in series in a zigzag manner.

From a cross-sectional view other than those in FIG. 2 and FIG. 3, an interlayer connecting member that is electrically connected to the back surface pattern 31 and is exposed on one surface of the back surface protective member 30 on the side opposite the insulating substrate 10 side is formed on the back surface protective member 30. Electrical connection between the back surface pattern 31 and the outside is achieved by this interlayer connecting member.

The configuration of the thermoelectric conversion device 1 according to the present embodiment is as described above. In the thermoelectric conversion device 1 such as this, for example, when the diameter of the first and second via holes 11 and 12 is φ0.7 mm, the thickness of the insulating substrate 10 is 1 mm, and a total of about 900 first and second interlayer connecting members 40 and 50 are disposed, about 2.5 mW of electric power can be obtained with a temperature difference of 10° C.

Figure 4:
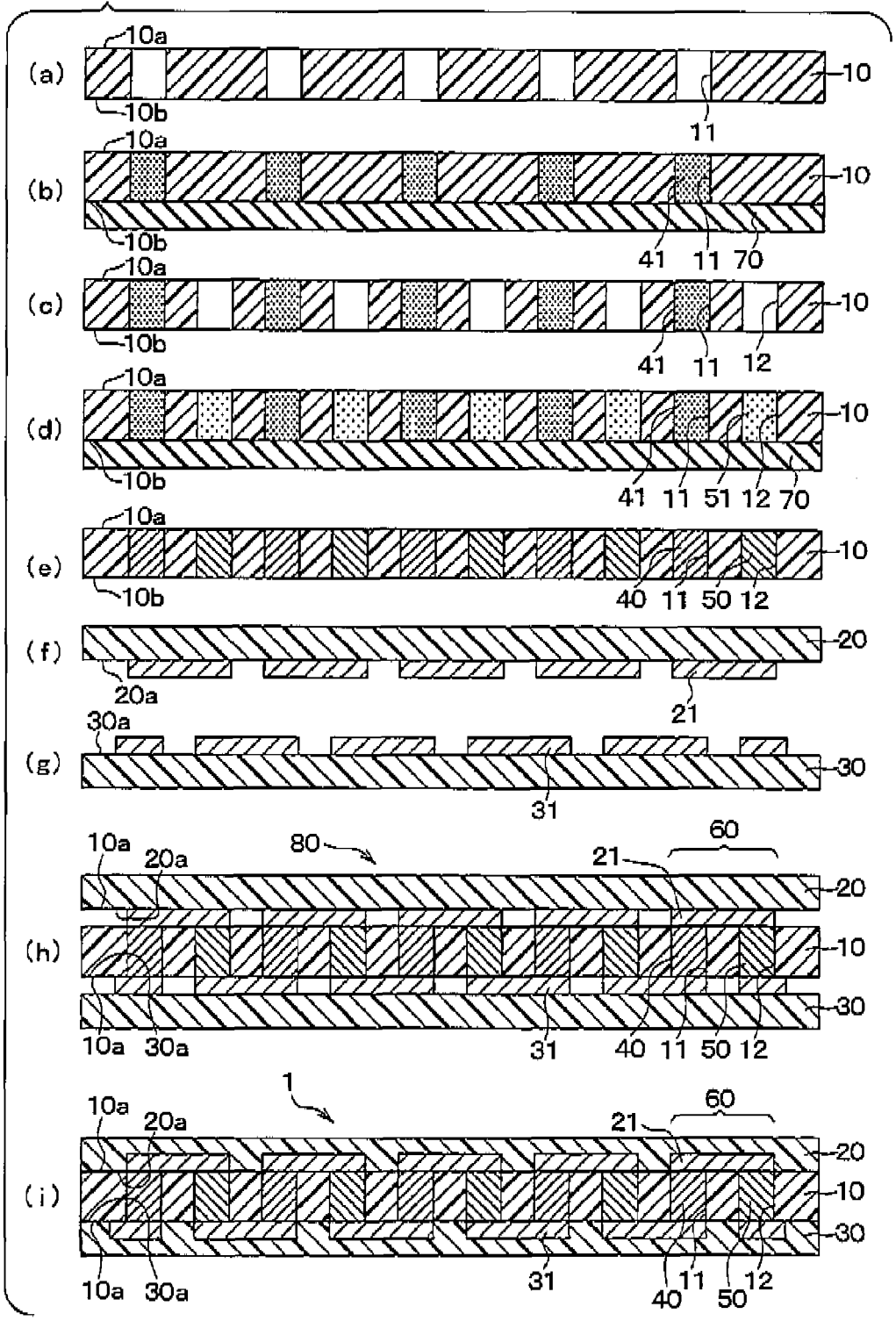
FIG. 4 is a cross-sectional view showing a manufacturing process of the thermoelectric conversion device shown in FIG. 1.

Next, a manufacturing method for the above-described thermoelectric conversion device 1 will be described with reference to FIG. 4. FIG. 4 is a cross-sectional view taken along line II-II in FIG. 1.

First, as shown in FIG. 4(a), the insulating substrate 10 is prepared, and the plurality of first via holes 11 are formed by a drill or the like.

Next, as shown in FIG. 4(b), each first via hole 11 is filled with the first conductive paste 41.

As a method (apparatus) for filling the first via holes 11 with the first conductive paste 41, a method (apparatus) described in Japanese Patent Application No. 2010-50356 by the applicant of the present application may be used.

Simply put, the insulating substrate 10 is disposed on a holder (not shown) with absorbent paper 70 therebetween, so that the back surface 10b opposes the absorbent paper 70. The absorbent paper 70 is merely required to be composed of a material capable of absorbing the organic solvent in the first conductive paste 41, and common wood-free paper or the like is used. Then, the first via holes 11 are filled with the first conductive paste 41 while the first conductive paste 41 is being melted. As a result, a large portion of the organic solvent in the first conductive paste 41 is absorbed by the absorbent paper 70, and the alloy powder is tightly packed in the first via holes 11.

According to the present embodiment, as the first conductive paste 41, the powder of an alloy, in which the metal atoms retain a predetermined crystalline structure, which has been formed into a paste by the addition of an organic solvent, such as paraffin, having a melting point of 43° C. is used. Therefore, filling with the first conductive paste 41 is performed in a state in which the front surface 10a of the insulating substrate 10 is heated to about 43° C. As the alloy powder composing the first conductive paste 41, for example, a Sb—Te based alloy or the like formed by mechanical alloying is used.

Next, as shown in FIG. 4(c), the plurality of second via holes 12 are formed in the insulating substrate 10 by a drill or the like. As described above, the second via holes 12 are formed so as to alternate with the first via holes 11 and configure a zigzag pattern with the first via holes 11.

Next, as shown in FIG. 4(d), the insulating substrate 10 is again disposed on the holder with the absorbent paper 70 therebetween, so that the back surface 10b opposes the absorbent paper 70. Then, in a manner similar to filling with the first conductive paste 41, the second via holes 12 are filled with the second conductive paste 51. As a result, a large portion of the organic solvent in the second conductive paste 51 is absorbed by the absorbent paper 70, and the alloy powder is disposed in close contact in the second via holes 12.

According to the present embodiment, as the second conductive paste 2, the powder of an alloy, in which metal atoms that differ from those composing the first conductive paste 41 retain a predetermined crystalline structure, which has been formed into a paste by the addition of an organic solvent, such as teripineol, of which the melting point is normal temperature is used. In other words, as the organic solvent composing the second conductive paste 51, an organic solvent that has a lower melting point than the organic solvent composing the first conductive paste 41 is used. Filling with the second conductive paste 51 is performed in a state in which the front surface 10a of the insulating substrate 10 is held at normal temperature. In other words, filling with the second conductive paste 51 is performed in a state in which the organic solvent contained in the first conductive paste 41 is solidified. As a result, infiltration of the second conductive paste 51 into the first via holes 11 can be suppressed.

As the alloy powder composing the second conductive paste 51, for example, a Bi—Te based alloy or the like formed by mechanical alloying is used.

The insulating substrate 10 that has been filled with the first conductive paste 41 and the second conductive paste 51 is prepared as described above.

Then, as shown in FIG. 4(e), the insulating substrate 10 is placed between a pair of press plates (not shown), and pressed from the front surface 10a and the back surface 10b of the insulating substrate 10 while being heated in a vacuum state, thereby forming the first and second interlayer connecting members 40 and 50. Although not particularly limited thereto, in this process, a cushioning material such as rock wool paper may be disposed between the insulating member 10 and the press plates. The process for forming the first and second interlayer connecting members 40 and 50 according to the present embodiment will be described in detail below, with reference to FIG. 5 and FIG. 6.

Figure 5:
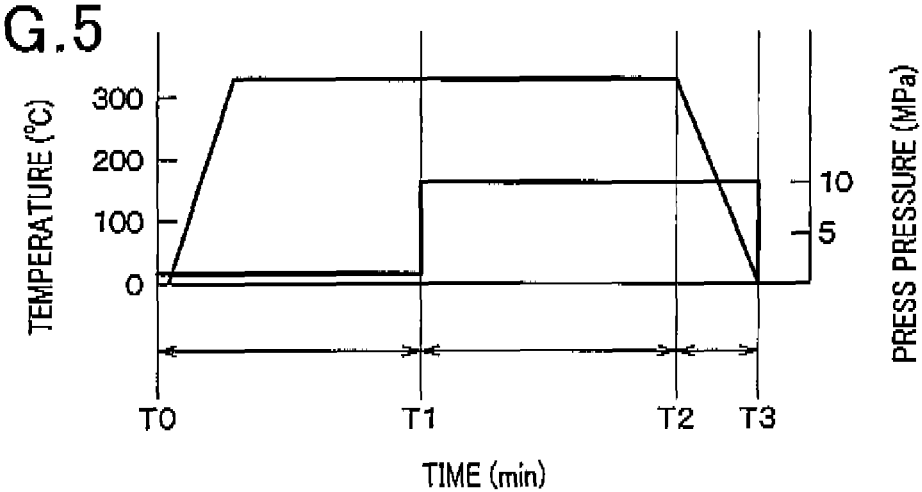
FIG. 5 is a diagram of the manufacturing conditions when forming first and second interlayer connecting members shown in FIG. 4(e)
Figure 6:
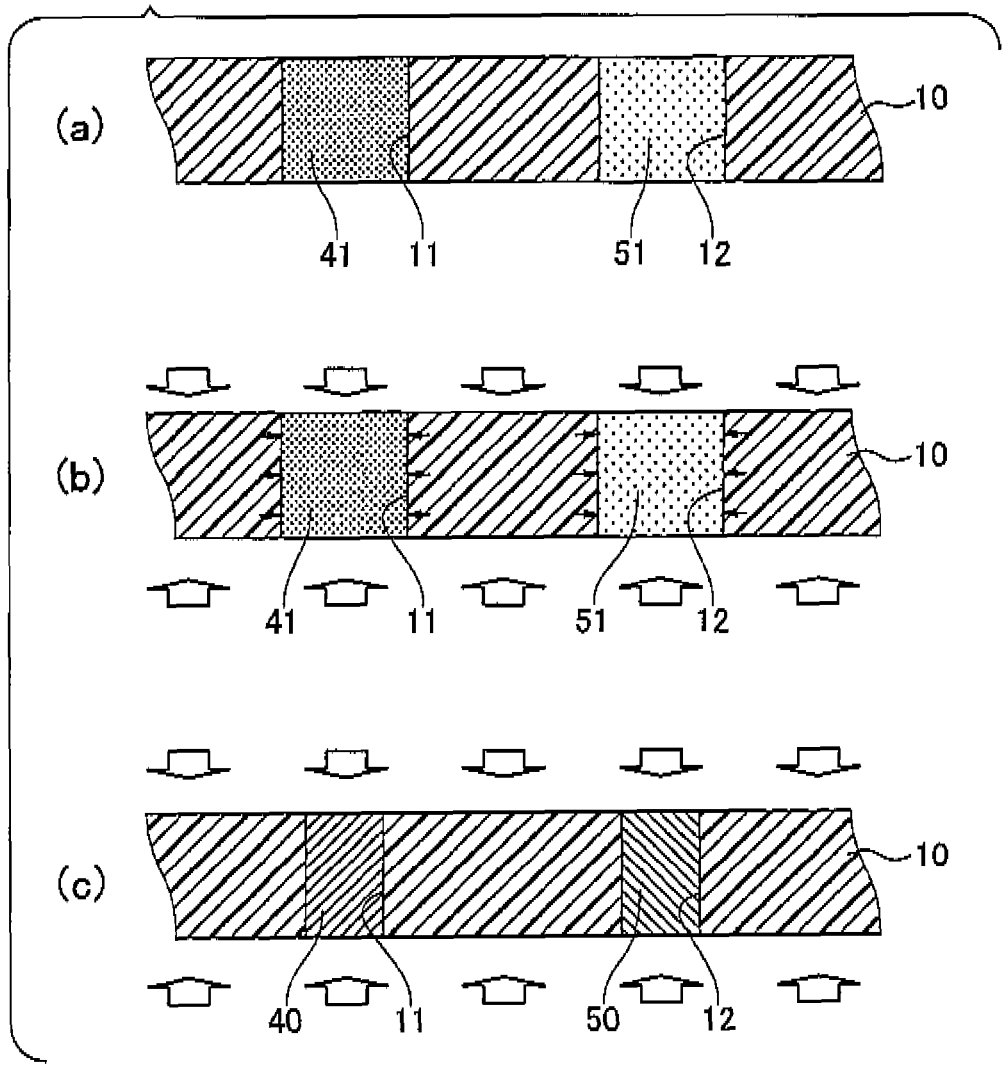
FIG. 6 is a detailed cross-sectional view of when the first and second interlayer connecting members shown in FIG. 4(e) are formed.

As shown in FIG. 5, in the process for forming the first and second interlayer connecting members 40 and 50, first, the insulating substrate 10 is pressed at 0.1 MPa until time T1, while being heated to about 320° C., and the organic solvents contained in the first and second conductive pastes 41 and 51 are evaporated (see FIG. 6(a)).

The amount of time from T0 to T1 is about 10 minutes. In addition, the organic solvents contained in the first and second conductive pastes 41 and 51 refer to the residual organic solvents that have not been absorbed by the absorbent paper 70 in the processes in FIG. 4(b) and FIG. 4(d).

Next, as shown in FIG. 5 and FIG. 6(b), the insulating substrate 10 is pressed at 10 MPa until time T2, while being held at about 320° C., which is a temperature equivalent to or higher than the softening point of the thermoplastic resin. At this time, the thermoplastic resin composing the insulating substrate 10 flows and presses the first and second conductive pastes 41 and 51 (alloy powders). Therefore, as shown in FIG. 6(c), the diameters of the first and second via holes 11 and 12 become smaller, and the alloy powder becomes pressed together, thereby forming the first and second interlayer connecting members 40 and 50. The amount of time from T1 to T2 is about 10 minutes.

Subsequently, as shown in FIG. 5, cooling is performed until time T3 while maintaining pressurization at 10 MPa. The amount of time from T2 to T3 is about eight minutes.

In addition, in a separate process from those described above, as shown in FIG. 4(f) and FIG. 4(g), copper foil or the like is formed on each of the one surfaces 20a and 30a of the front surface protective member 20 and the back surface protective member 30 opposing the insulating substrate 10. As a result of the copper foil being patterned as appropriate, the front surface protective member 20 on which a plurality of front surface patterns 21 that are separated from each other are formed and the back surface protective member 30 on which a plurality of back surface patterns 31 that are separated from each other are formed are prepared.

Subsequently, as shown in FIG. 4(h), the back surface protective member 30, the insulating substrate 10, and the front surface protective member 20 are laminated in this order, thereby configuring a laminate 80. Specifically, when the first conductive paste 41 filling a single first via hole 11 and the second conductive paste 51 filling a single second via hole 12 that are adjacent to each other are considered to be a pair 60, the front surface protective member 20 is disposed on the front surface 10a side of the insulating substrate 10 in a state in which the first and second conductive pastes 41 and 51 of each pair 60 are in contact with the same front surface pattern 21. According to the present embodiment, as described above, the first conductive paste 41 filling a single first via hole 11 and the second conductive paste 51 filling a single second via hole 12 that are adjacent along the long-side direction of the insulating substrate 10 (the left/right direction of the paper in FIG. 1) are considered to be a pair 60.

In addition, the back surface protective member 30 is disposed on the back surface 10b side of the insulating substrate 10 in a state in which the first conductive paste 41 of one pair 60 of adjacent pairs 60 and the second conductive paste 51 of the other pair 60 are in contact with the same back surface pattern 31. According to the present embodiment, as described above, two pairs 60 that are aligned along the long-side direction of the insulating substrate 10 (the left/right direction of the paper in FIG. 1) are considered to be adjacent pairs 60. In addition, the two pairs 60 that are aligned along the short-side direction are considered to be adjacent pairs 60 on the outer edge of the insulating substrate 10.

Next, as shown in FIG. 4(i), the laminate 80 is disposed between a pair of press plates (not shown) and pressed from both the top and bottom surfaces in the lamination direction, while being heated in a vacuum state, thereby integrating the laminate 80. In this process, in a manner similar to the process in FIG. 4(e), a cushioning material such as rock wool paper may be disposed between the laminate 80 and the press plates. The integration process according to the present embodiment will be described in detail below, with reference to FIG. 7.

Figure 7:
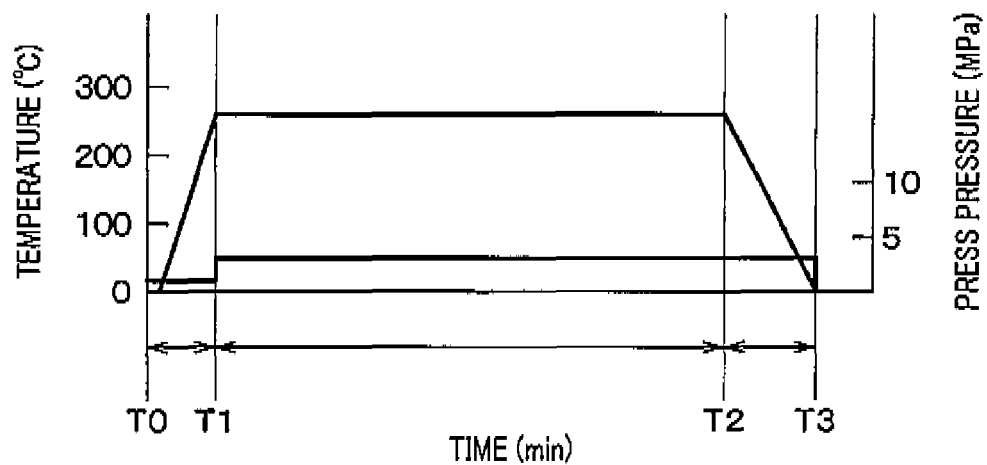
FIG. 7 is a diagram of the manufacturing conditions for an integration process shown in FIG. 4(i)

In the process for integrating the laminate 80, as shown in FIG. 7, first, the laminate 80 is pressed from time T1 to T2 at 3 MPa after being to about 280° C., which is a temperature equivalent to or higher than the softening point of the thermoplastic resin composing the insulating substrate 10. At this time, the first and second interlayer connecting members 40 and 50 are pressed against the front surface patterns 21 and the back surface patterns 31 and electrically connected.

The amount of time from T1 to T2 is about eight minutes. In addition, sintering such as that in the process in FIG. 4(e) is not performed in this process. Therefore, this process is performed under low-temperature, low-pressure conditions, compared to the process in FIG. 4(e).

Subsequently, as shown in FIG. 7, the laminate 80 is integrated by being cooled until time T3, while maintaining pressurization at 3 MPa. The thermoelectric conversion device 1 shown in FIG. 1 is thereby manufactured. The amount of time from T2 to T3 is about eight minutes.

As described above, according to the present embodiment, the process for forming the first and second interlayer connecting members 40 and 50, and the process for electrically connecting the first and second interlayer connecting members 40 and 50 to the front surface patterns 21 and the back surface patterns 31 and integrating the laminate 80 are performed as separate processes. Therefore, manufacturing conditions can be set for each process, and the manufacturing process can be simplified.

Specifically, in the process for forming the first and second interlayer connecting members 40 and 50, processing can be performed under high-temperature, high-pressure conditions of 320° C. and 10 MPa, and a situation in which the first and second interlayer connecting members 40 and 50 are not solid-phase sintered can be suppressed.

In addition, in the process for integrating the laminate 80, processing can be performed under low-temperature, low-pressure conditions of 280° C. and 3 MPa. Therefore, formation of an alloy layer composed of the first and second interlayer connecting members 40 and 50, and the front surface patterns 21 or the back surface patterns 31, between the first and second interlayer connecting members 40 and 50 and the front surface patterns 21 or the back surface patterns 31 can be suppressed.

According to the present embodiment, an example is described in which a Sb—Te based alloy powder is used as the first conductive paste 41 and a Bi—Te based alloy powder is used as the second conductive paste 51. However, the alloy powders are not limited thereto. For example, as the alloy powders composing the first and second conductive pastes 41 and 51, alloys may be selected as appropriate from among alloys in which copper, constantan, chromel, alumel, or the like is alloyed with iron, nickel, chrome, copper, silicon, or the like. In addition, alloys may be selected as appropriate from among an alloy of tellurium, bismuth, antimony, and selenium, an alloy of silicon, iron, and aluminum, and the like.

Second Embodiment

A second embodiment of the present invention will be described. According to the present embodiment, in relation to the first embodiment, a process for forming a plating film is performed after the first and second interlayer connecting members 40 and 50 are formed. Other aspects are similar to those according to the first embodiment and, therefore, descriptions thereof are omitted herein.

Figure 8:
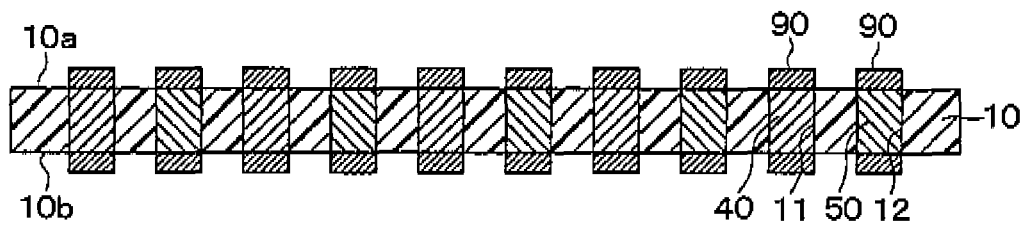
FIG. 8 is a cross-sectional view of a process performed after FIG. 4(e) according to a second embodiment of the present invention.

As shown in FIG. 8, according to the second embodiment, after the process in FIG. 4(e), a plating film 90 composed of Ni or the like is formed on the portions of the first and second interlayer connecting members 40 and 50 that are exposed from the insulating substrate 10.

The portions of the first and second interlayer connecting members 40 and 50 that are exposed from the insulating substrate 10 are, in other words, areas that are pressed against the front surface patterns 21 or the back surface patterns 31 according to the first embodiment. In addition, the plating film 90 is formed, for example, by electroless plating.

As a result, effects similar to those according to the above-described first embodiment can be achieved while further suppressing the formation of an alloy layer composed of the first and second interlayer connecting members 40 and 50, and the front surface patterns 21 or the back surface patterns 31 by the plating film 90 when the laminate 80 is integrated in the process in FIG. 4(i).

Third Embodiment

A third embodiment of the present invention will be described. According to the present embodiment, in relation to the first embodiment, a process for forming through holes in the insulating substrate 10 is performed. Other aspects are similar to those according to the first embodiment and, therefore, descriptions thereof are omitted herein.

Figure 9:
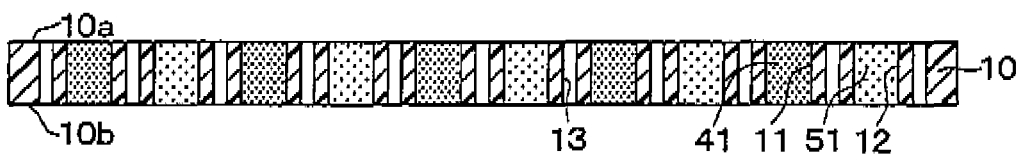
FIG. 9 is a cross-sectional view of a process performed after FIG. 4(d) according to a third embodiment of the present invention.
Figure 10:
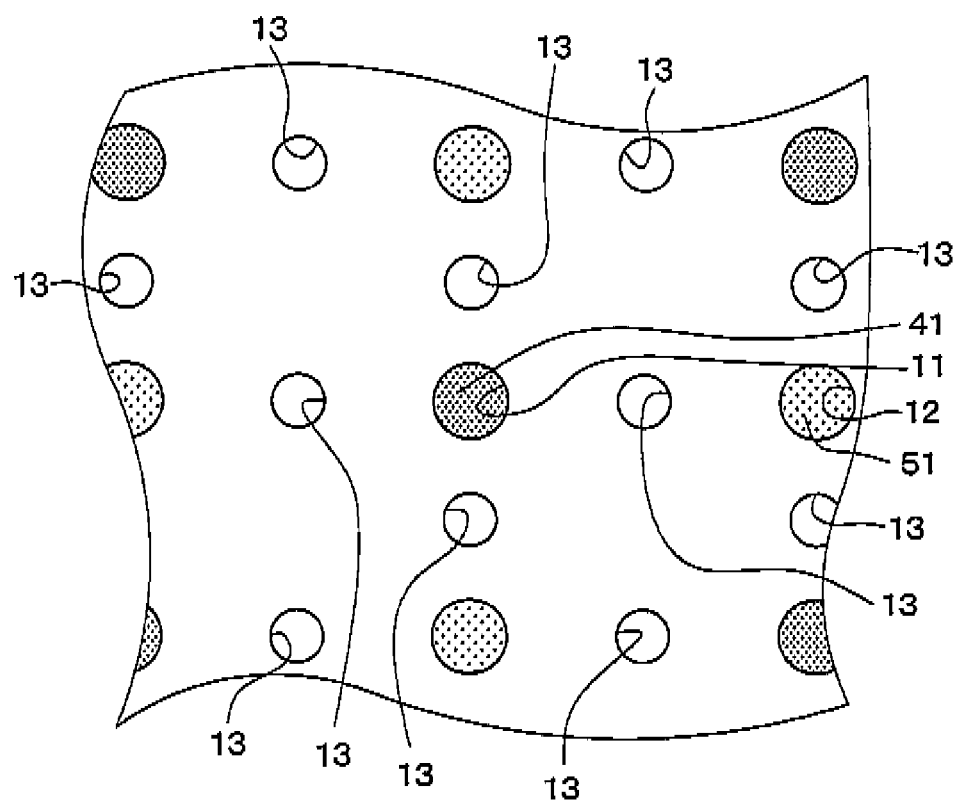
FIG. 10 is a front surface view of an insulating substrate shown in FIG. 9.

As shown in FIG. 9 and FIG. 10, according to the present embodiment, after the process in FIG. 4(d), through holes 31 corresponding to pores of the present invention are formed by a drill, a laser, or the like. According to the present embodiment, as shown in FIG. 9 and FIG. 10, a plurality of through holes 13 that have a circular cylindrical shape are formed around each of the first and second via holes 11 and 12, so as to be concentric and separated from each other at even intervals in a circumferential direction.

Here, the through holes 13 are described as having a circular cylindrical shape. However, the through hole 13 may have a tapered shape in which the diameter becomes smaller from the front surface 10a towards the back surface 10b, or may have a rectangular cylindrical shape.

Figure 11:
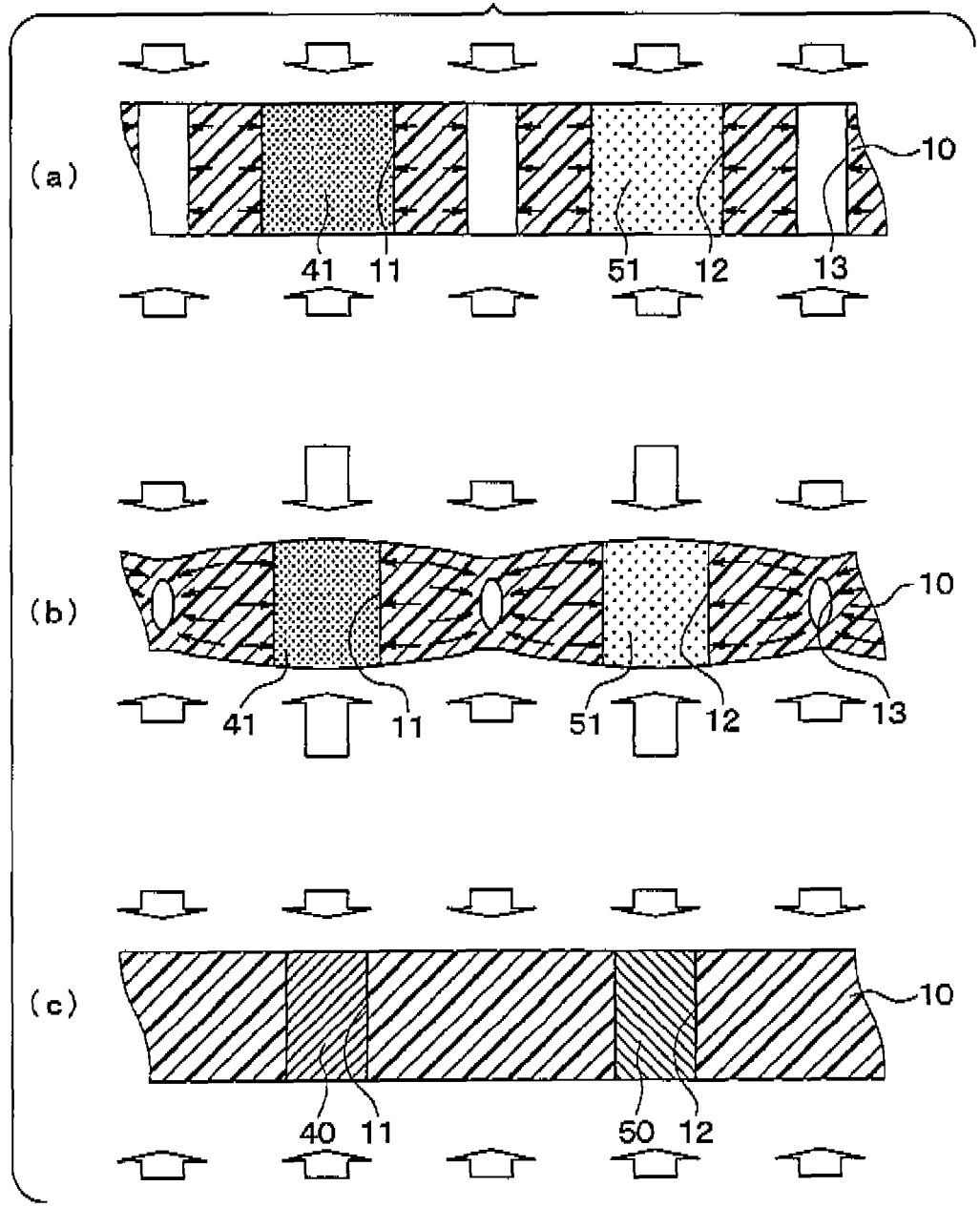
FIG. 11 is a detailed cross-sectional view of when the process in FIG. 4(e) is performed using the insulating substrate shown in FIG. 9.

The process in FIG. 4(e) is then performed, and the first and second interlayer connecting members 40 and 50 are formed. At this time, as shown in FIG. 11(a), when pressed from the front surface 1a and the back surface 10b of the insulating substrate 10, as shown in FIG. 11(b), the thermoplastic resin composing the insulating substrate 10 flows thereby pressing the first and second conductive pastes 41 and 51 and flowing into the through holes 31. Then, because the thermoplastic resin flows into the through holes 13, the pressurizing force applied to this portion (the vicinity of the first and second via holes 11 and 12) decreases, and the pressurizing force that originally should be applied to this portion is applied to the first and second conductive pastes 41 and 51. Therefore, the first and second interlayer connecting members 40 and 50 can be formed as shown in FIG. 11(c) while increasing the pressurizing force applied to the first and second conductive pastes 41 and 51 by the press plates.

As described above, according to the present embodiment, the through holes 13 are formed in the insulating substrate 10, and the first and second interlayer connecting members 40 and 50 are formed while making the thermoplastic resin flow into the through holes 13. Therefore, the pressurizing force applied to the first and second conductive pastes 41 and 51 can be increased, and a situation in which the first and second conductive pastes 41 and 51 are not solid-phase sintered can be suppressed.

In addition, according to the present embodiment, the through holes 13 are formed around each of the first and second via holes 11 and 12 so as to be concentric and separated from each other at even intervals in the circumferential direction. Therefore, when the first and second interlayer connecting members 40 and 50 are formed, the thermoplastic resin in the vicinity of the first and second via holes 11 and 12 can more easily flow isotropically to the through holes 13, and displacement of the first and second via holes 11 and 12 in the planar direction of the insulating substrate 10 can be suppressed.

Fourth Embodiment

A fourth embodiment of the present invention will be described. According to the present embodiment, in relation to the third embodiment, a process for forming groove portions in the insulating substrate 10 is performed. Other aspects are similar to those according to the third embodiment and, therefore, descriptions thereof are omitted herein.

Figure 12:
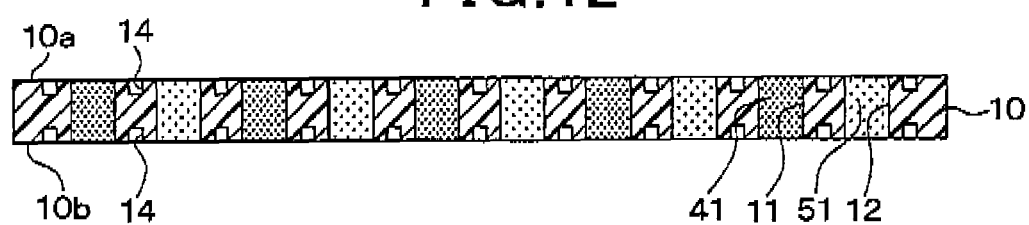
FIG. 12 is a cross-sectional view of a process performed after FIG. 4(d) according to a fourth embodiment of the present invention.
Figure 13:
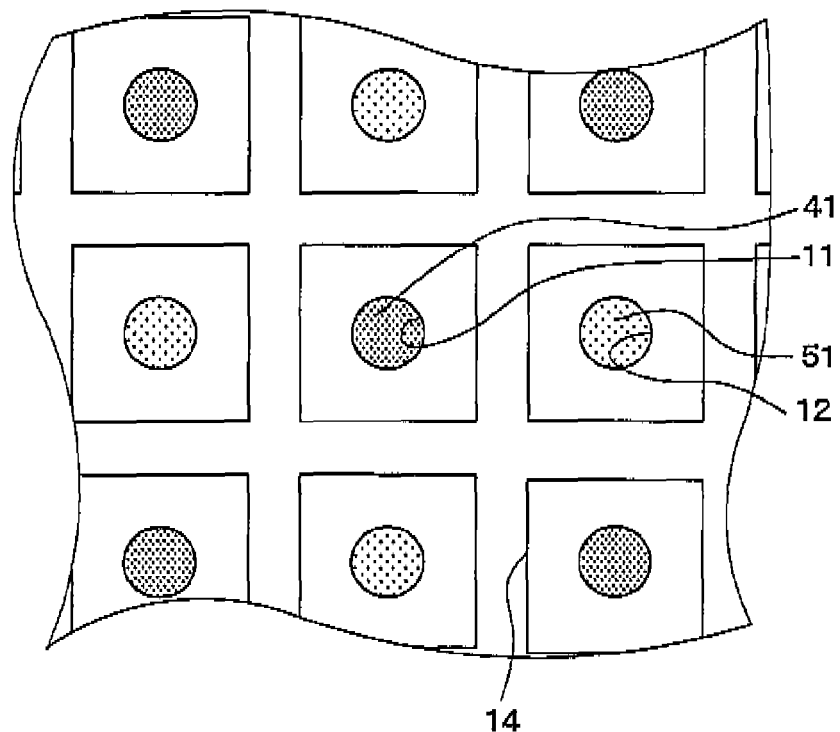
FIG. 13 is a front surface view of an insulating substrate shown in FIG. 12.

As shown in FIG. 12 and FIG. 13, according to the present embodiment, after the process in FIG. 4(*d*), frame-shaped groove portions 14 that surround the first and second via holes 11 and 12 are formed in the insulating substrate 10 by a drill, a laser, or the like. Specifically, the groove portions 14 are formed on the front surface 10*a* of the insulating substrate 10 so that either of the first via hole 11 or the second via hole 12 is positioned one in each frame. In a similar manner, the groove portions 14 are formed on the back surface 10*b* of the insulating substrate 10 so that either of the first via hole 11 or the second via hole 12 is positioned one in each frame.

According to the present embodiment, the groove portions 14 correspond to the pores of the present invention. In addition, although the groove portions 14 surrounding each of the first and second via holes 11 and 12 are formed into a grid shape herein, the groove portions 14 may be formed so as to be separated from each other. Furthermore, according to the present embodiment, the groove portions 14 formed on the front surface 10*a* and the back surface 10*b* of the insulating substrate 10 have the same size. The groove portions 14 are formed so that the first via hole 11 or the second via hole 12 is positioned in the center of the frame.

Even when the groove portions 14 are formed in the insulating substrate 10 in this way, in the process in FIG. 4(*e*), the thermoplastic resin flows into the groove portions 14 when the first and second interlayer connecting members 40 and 50 are formed. Therefore, the pressurizing force applied to the first and second conductive pastes 41 and 51 can be increased, and effects similar to those according to the above-described third embodiment can be achieved.

Formation of the groove portions 14 on the front surface 10*a* and the back surface 10*b* of the insulating substrate 10 is described herein. However, the groove portions 14 may be formed on only either of the front surface 10*a* and the back surface 10*b* of the insulating substrate 10.

Fifth Embodiment

A fifth embodiment of the present invention will be described. According to the present embodiment, in relation to the third embodiment, the insulating substrate 10 is changed. Other aspects are similar to those according to the third embodiment and, therefore, descriptions thereof are omitted herein.

Figure 14:
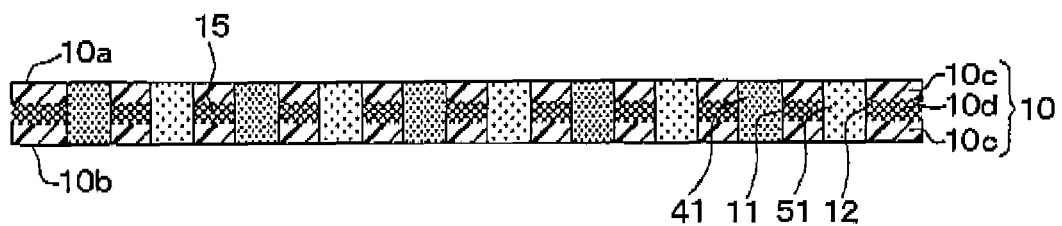
FIG. 14 is a cross-sectional view corresponding to FIG. 4(d), according to a fifth embodiment of the present invention.

As shown in FIG. 14, according to the present embodiment, that in which a thermoplastic resin film 10*c*, a glass cloth 10*d* having pores 15 therewithin, and the thermoplastic resin film 10*c* are laminated in this order and temporarily joined by low-temperature pressing or the like is used as the insulating substrate 10. According to the present embodiment, the glass cloth 10*d* corresponds to a porous material of the present invention, and the pores 15 within the glass cloth 10*d* correspond to the pores of the present invention.

Even when the insulating substrate 10 such as this is used, in the process in FIG. 4(*e*), the thermoplastic resin flows into (impregnates) the pores 15 in the glass cloth 10*d* when the first and second interlayer connecting members 40 and 50 are formed. Therefore, the pressuring force applied to the first and second conductive pastes 41 and 51 can be increased, and effect similar to those according to the above-described third embodiment can be achieved.

The glass cloth 10*d* is given as an example of the porous material and described herein. However, for example, an aramid non-woven cloth may be used as the porous material.

Sixth Embodiment

A sixth embodiment of the present invention will be described. According to the present embodiment, in relation to the third embodiment, the insulating substrate 10 is changed. Other aspects are similar to those according to the first embodiment and, therefore, descriptions thereof are omitted herein.

Figure 15:
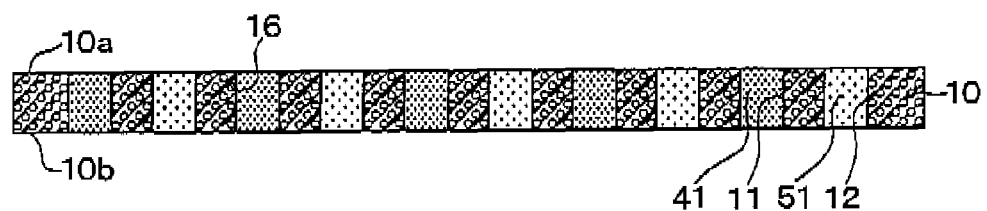
FIG. 15 is a cross-sectional view corresponding to FIG. 4(d), according to a sixth embodiment of the present invention.

As shown in FIG. 15, according to the present embodiment, a porous insulating substrate in which a plurality of holes 16 are formed in a thermoplastic resin film is used as the insulating substrate 10. Even when the insulating substrate 10 such as this is used, in the process in FIG. 4(*e*), the thermoplastic resin flows into the holes 16 when the first and second interlayer connecting members 40 and 50 are formed. Therefore, the pressurizing force applied to the first and second conductive pastes 41 and 51 can be increased, and effect similar to those according to the above-described third embodiment can be achieved.

Seventh Embodiment

A seventh embodiment of the present invention will be described. According to the present embodiment, in relation to the third embodiment, the press plate is changed. Other aspects are similar to those according to the first embodiment and, therefore, descriptions thereof are omitted herein.

Figure 16:
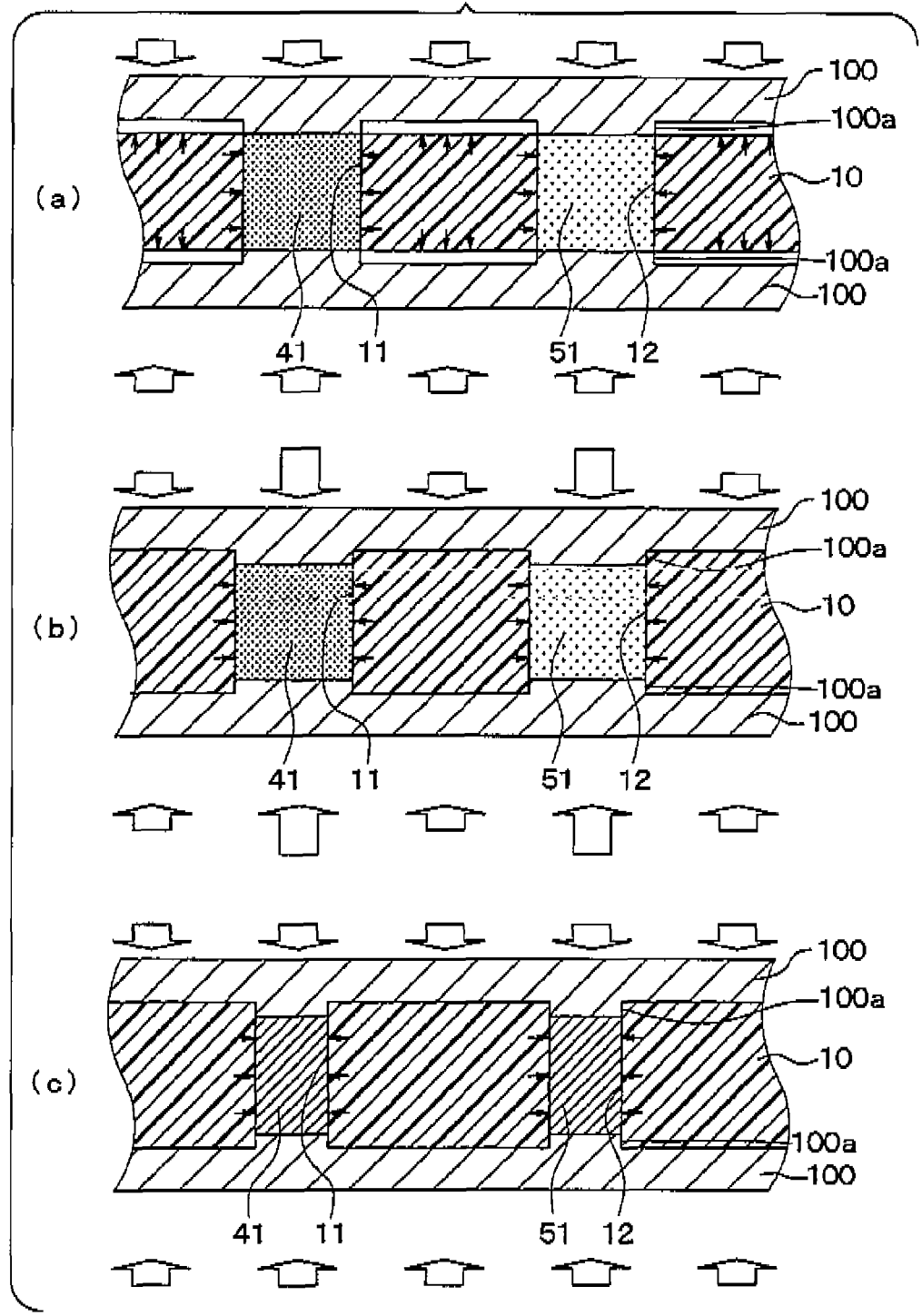
FIG. 16 is a detailed cross-sectional view of when the first and second interlayer connecting members shown in FIG. 4(e) are formed, according to a seventh embodiment.

As shown in FIG. 16(*a*), according to the present embodiment, the laminate 80 is pressed using a pair of press plates 100 in which recessing portions 100*a* are formed in portions differing from the portions that come into contact with the first and second conductive pastes 41 and 51.

As a result, as shown in FIG. 16(*b*), the thermoplastic resin flows into each recessing portion 100*a* of the pair of press plates 100. Therefore, the first and second interlayer connecting members 40 and 50 can be formed as shown in FIG. 16(*c*), while increasing the pressurizing force applied to the first and second conductive pastes 41 and 51 by the press plates 100.

Even when the process in FIG. 4(*e*) is performed using the pair of press plates 100 in which the recessing portions 100*a* are formed in this way, because the thermoplastic resin flows into the recessing portions 100*a*, the pressurizing force applied to the first and second conductive pastes 41 and 51 can be increased, and effects similar to those according to the above-described third embodiment can be achieved.

When the process in FIG. 4(*e*) is performed in this way, projecting portions are formed by the thermoplastic resin that has flowed into the recessing portion 100*a*. Therefore, the projecting portion may be removed by cutting or the like. In addition, even when the process in FIG. 4(*i*) is performed with the projecting portions as is, no particular problems occur because the thermoplastic resin will flow again.

An example in which the recessing portions 100*a* are formed in each of the pair of press plates 100 is described herein. However, press plates 100 may be used in which the recessing portions 100a are formed only in either of the pair of press plates 100.

Eighth Embodiment

An eighth embodiment of the present invention will be described. According to the present embodiment, in relation to the first embodiment, the manufacturing process for preparing the insulating substrate 10 that is filled with the first and second conductive pastes 41 and 51 is changed. Other aspects are similar to those according to the first embodiment and, therefore, descriptions thereof are omitted herein.

Figure 17:
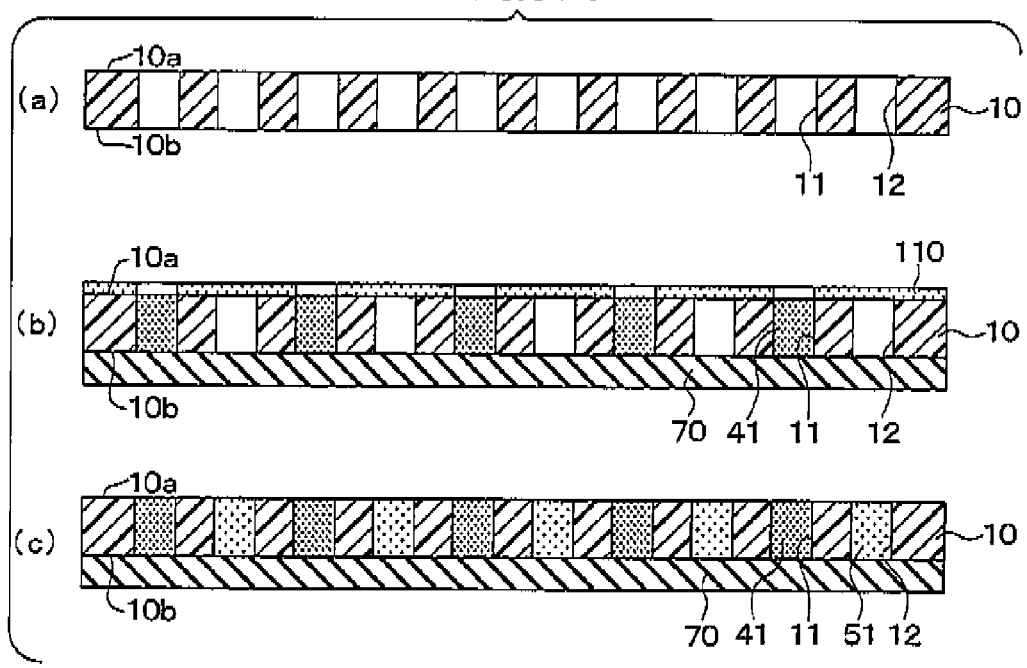
FIG. 17 is a cross-sectional view of a manufacturing process in a process for preparing an insulating substrate, according to an eighth embodiment of the present invention.

As shown in FIG. 17(a), according to the present embodiment, the first and second via holes 11 and 12 are simultaneously formed in the insulating substrate 10.

Next, as shown in FIG. 17(b), a mask 110 in which the areas corresponding to the first via holes 11 are open is disposed on the front surface 10a of the insulating substrate 10. Only the first via holes 11 are filled with the first conductive paste 41.

Then, as shown in FIG. 17(c), the mask 110 is removed, and in a manner similar to that according to the first embodiment, filling with the second conductive paste 51 is performed at normal temperature. As a result, the insulating substrate 10 that is filled with the first and second conductive pastes 41 and 51 is prepared. Subsequently, the thermoelectric conversion device 1 shown in FIG. 1 is manufactured by processes similar to those according to the first embodiment being performed.

As described above, according to the present embodiment, the first and second via holes 11 and 12 are simultaneously formed in the insulating substrate 10, and the processes for forming the via holes can be performed at the same time.

After the first via holes 11 are filled with the first conductive paste 41, a mask in which the areas corresponding to the second via holes 12 are open may be disposed on the front surface 10a of the insulating substrate 10. In this case, when the second via holes 12 are filled with the second conductive paste 51, the mask suppresses infiltration of the second conductive paste 51 into the first via holes 11. Therefore, as the organic solvent composing the second conductive paste 51, an organic solvent that melts the first conductive paste 41 can be used when filling with the second conductive paste 51, and for example, paraffin can be used similarly to the organic solvent in the first conductive paste 41.

Other Embodiments

The present invention is not limited to the above-described embodiments and can be modified as appropriate within a range recited in the scope of claims.

For example, the second embodiment may be combined with the third to eighth embodiments, and the plating film 90 may be formed on the first and second interlayer connecting members 40 and 50. In addition, the third and fourth embodiments may be combined with the fifth and sixth embodiments as appropriate, and the through holes 13 or the groove portions 14 may be formed as appropriate when the glass cloth 10d or the thermoplastic resin film 10c in which a plurality of holes 16 are formed is used. Furthermore, the seventh embodiment may be combined with the third to eighth embodiments, and the process for forming the first and second interlayer connecting members 40 and 50 in FIG. 4(e) may be performed using the pair of press plates 100 in which the recessing portions 100a are formed.

In addition, according to the above-described embodiments, the second via holes 12 may be filled with the second conductive paste 51 that contains Ag—Sn based metal particles or the like. In other words, in the second via holes 12, second interlayer connecting members 50 for achieving conduction, rather than to mainly impart thermoelectric effects, may be formed. In this case, the locations in which the first and second via holes 11 and 12 are formed may be changed as appropriate, the shapes of the front surface patterns 21 and the back surface patterns 31 may be changed as appropriate, and the first interlayer connecting members 40 that are disposed along the long-side direction of the insulating substrate 10 may be connected in parallel.

According to each of the above-described embodiments, only the first via holes 11 may be formed in the insulating substrate 10, and the first via holes 11 may be filled only with the first conductive paste 41. In other words, the present invention can be applied to a manufacturing method for a thermoelectric conversion device in which only one type of interlayer connecting member is disposed in the insulating substrate 10.

REFERENCE SIGNS LIST 10 insulating substrate
10a front surface
10b back surface
11 first via hole
12 second via hole
20 front surface protective member
21 front surface pattern
30 back surface protective member
31 back surface pattern
40 first interlayer connecting member
41 first conductive paste
50 second interlayer connecting member
51 second conductive paste
80 laminate

What is claimed is:

1. A manufacturing method for a thermoelectric conversion device comprising:
   a step of preparing an insulating substrate that is configured to contain a thermoplastic resin, in which a plurality of via holes that penetrate in a thickness direction are formed, and the via holes are filled with a conductive paste that is produced by adding an organic solvent to a powder of an alloy in which a plurality of metal atoms retain a predetermined crystalline structure, and by processing the powder of the alloy into a paste;
   a step of solid-phase sintering the conductive paste and forming interlayer connecting members by pressing the insulating substrate from a front surface of the insulating substrate and a back surface on a side opposite to that of the front surface, while heating;
   a step of forming a laminate by disposing a front surface protective member having front surface patterns that come into contact with predetermined interlayer connecting members on the front surface of the insulating substrate and disposing a back surface protective member having back surface patterns that come into contact with predetermined interlayer connecting members on the back surface of the insulating substrate; and
   a step of integrating the laminate while electrically connecting the interlayer connecting members to the front surface patterns and the back surface patterns, by pressing the laminate from the lamination direction while heating, wherein in the step of integrating the laminate, a lower pressurizing force is applied while heating at a lower temperature, compared to the temperature and pressurizing force in the step of forming the interlayer connecting members.

2. The manufacturing method for a thermoelectric conversion device according to claim 1, wherein:

portions of the interlayer connecting members are exposed from the insulating substrate; and a plating film is formed in the portions of the interlayer connecting members that are exposed from the insulating substrate, after the step of forming the interlayer connecting members and before the step of forming the laminate.

3. The manufacturing method for a thermoelectric conversion device according to claim 1, wherein:

pores are formed within the insulating substrate before the step of forming the interlayer connecting members; and in the step of forming the interlayer connecting members, the interlayer connecting members are formed by solid-phase sintering the conductive paste, while making the thermoplastic resin flow into the pores.

4. The manufacturing method for a thermoelectric conversion device according to claim 3, wherein:

through holes are formed in the insulating substrate before the step of forming the interlayer connecting members.

5. The manufacturing method for a thermoelectric conversion device according to claim 4, wherein:

in the step of forming the through holes, a plurality of through holes are formed around each via hole so as to be concentric and separated from each other at an even interval in a circumferential direction.

6. The manufacturing method for a thermoelectric conversion device according to claim 3, wherein:

frame-shaped groove portions are formed so that the via holes are positioned one in each frame of the groove portions, before the step of forming the interlayer connecting members.

7. The manufacturing method for a thermoelectric conversion device according to claim 1, wherein:

the insulating substrate further contains a porous member.

8. The manufacturing method for a thermoelectric conversion device according to claim 1, wherein:

in the step of forming the interlayer connecting members, a pair of press plates in which recessing portions are formed in portions differing from the portions that come into contact with the conductive paste is prepared, and the interlayer connecting members are formed by solid-phase sintering the conductive paste while making the thermoplastic resin flow into the recessing portions.

9. The manufacturing method for a thermoelectric conversion device according to claim 2, wherein:

pores are formed within the insulating substrate before the step of forming the interlayer connecting members; and in the step of forming the interlayer connecting members, the interlayer connecting members are formed by solid-phase sintering the conductive paste, while making the thermoplastic resin flow into the pores.

10. The manufacturing method for a thermoelectric conversion device according to claim 9, wherein:

through holes are formed in the insulating substrate before the step of forming the interlayer connecting members.

11. The manufacturing method for a thermoelectric conversion device according to claim 10, wherein:

in the step of forming the through holes, a plurality of through holes are formed around each via hole so as to be concentric and separated from each other at an even interval in a circumferential direction.

12. The manufacturing method for a thermoelectric conversion device according to claim 9, wherein:

frame-shaped groove portions are formed so that the via holes are positioned one in each frame of the groove portions, before the step of forming the interlayer connecting members.

13. The manufacturing method for a thermoelectric conversion device according to claim 2, wherein:

the insulating substrate further contains a porous member.

14. The manufacturing method for a thermoelectric conversion device according to claim 2, wherein:

in the step of forming the interlayer connecting members, a pair of press plates in which recessing portions are formed in portions differing from the portions that come into contact with the conductive paste is prepared, and the interlayer connecting members are formed by solid-phase sintering the conductive paste while making the thermoplastic resin flow into the recessing portions.

\* \* \* \* \*